United States Patent
Chu (10) Patent No.: US 9,067,797 B2
(45) Date of Patent: Jun. 30, 2015

(54) METHODS AND SYSTEMS TO PRODUCE LARGE PARTICLE DIAMONDS

(76) Inventor: Xi Chu, Beijing (CN)

( * ) Notice: Subject to any disclaimer, the term of this patent is extended or adjusted under 35 U.S.C. 154(b) by 555 days.

(21) Appl. No.: 13/265,496

(22) PCT Filed: Apr. 27, 2010

(86) PCT No.: PCT/CN2010/072253
§ 371 (c)(1),
(2), (4) Date: Feb. 7, 2012

(87) PCT Pub. No.: WO2010/124625
PCT Pub. Date: Nov. 4, 2010

(65) Prior Publication Data
US 2012/0195819 A1    Aug. 2, 2012

(30) Foreign Application Priority Data

Apr. 28, 2009 (CN) .......................... 2009 1 0138324

(51) Int. Cl.
| | |
|---|---|
| *C01B 31/06* | (2006.01) |
| *C23C 16/27* | (2006.01) |
| *C30B 25/10* | (2006.01) |
| *C30B 29/04* | (2006.01) |

(52) U.S. Cl.
CPC .............. *C01B 31/06* (2013.01); *C23C 16/27* (2013.01); *C30B 25/105* (2013.01); *C30B 29/04* (2013.01)

(58) Field of Classification Search
None
See application file for complete search history.

(56) References Cited

U.S. PATENT DOCUMENTS

| | | | |
|---|---|---|---|
| 5,015,528 A | 5/1991 | Pinneo | |
| 5,087,434 A * | 2/1992 | Frenklach et al. | 423/446 |
| 5,372,799 A * | 12/1994 | Adschiri et al. | 423/446 |
| 5,672,382 A | 9/1997 | Lux | |
| 6,015,597 A * | 1/2000 | David | 427/577 |
| 7,235,130 B2 * | 6/2007 | Hemley et al. | 117/89 |
| 2009/0175777 A1 * | 7/2009 | Scarsbrook et al. | 423/446 |
| 2011/0014112 A1 * | 1/2011 | Misra | 423/446 |
| 2011/0150745 A1 * | 6/2011 | Twitchen et al. | 423/446 |
| 2011/0151226 A1 * | 6/2011 | Twitchen et al. | 428/220 |
| 2011/0176563 A1 * | 7/2011 | Friel et al. | 372/3 |
| 2015/0030786 A1 * | 1/2015 | Coe et al. | 427/575 |

FOREIGN PATENT DOCUMENTS

JP    3-122094 A    5/1991

OTHER PUBLICATIONS

"International Application Serial No. PCT/CN2010/072253, International Search Report mailed Aug. 12, 2010", (w/ English Translation), 4 pgs.

Chen, Q., et al., "Recent progress in diamond snythesis", *Physics*, 34(3), (2005), 199-203.

* cited by examiner

*Primary Examiner* — Guinever Gregorio (57) ABSTRACT

The invention provides methods and systems for producing large size diamonds. The methods include using carbon containing gases and supplementary gases to form reaction zones that are suitable for diamonds to grow; controlling the temperatures that are suitable for diamonds to grow; and keeping the small size seeds in motion in the reaction zones to form large size diamonds. The method provides controlling the high temperature endurable small size seeds at suitable temperatures for diamonds to grow and keep them in motion in the reaction zones. The invention also provides systems that allow all the surfaces of the high temperature endurable small size seeds continually extend to form diamonds, then to form large size diamonds. The invention provides a large-scale, low cost production of large size diamonds.

8 Claims, 4 Drawing Sheets

METHODS AND SYSTEMS TO PRODUCE LARGE PARTICLE DIAMONDS

RELATED APPLICATIONS

This application is a U.S. National Stage Filing under 35 U.S.C. 371 from International Application No. PCT/CN2010/072253 filed on Apr. 27, 2010 and published as WO 2010/124625 A1 on Nov. 4, 2010; which international patent application claims the benefit of priority, under 35 U.S.C. §119 to Chinese Patent Application Serial No. 200910138324.0, filed Apr. 28, 2009; which applications and publication are incorporated herein by reference in their entirety.

FIELD OF THE INVENTION

The present invention relates to methods and systems to produce diamonds. In particular, it is directed to methods and equipments to produce large size diamonds.

BACKGROUND

As the hardest substance in nature, diamond has a lot of industrial applications, such as fine polishing materials, high hardness cutting tools, all sorts of augers, drawing dies, and parts for many precision instruments. However, there are rarely any high quality, large size (>1 mm) diamonds found in nature and they are very expensive. Therefore, there is a need to manufacture diamonds of large size.

In the currently available techniques, Chemical Vapor Deposition (CVD) can be applied to artificially produce diamonds. Using this method, the carbon containing gases (such as methane (CH4)) and hydrogen ($H_2$) are first mixed at a certain ratio, and then excited by passing through RF plasma, direct current arc, microwave plasma, hot filament, or combustion flame. The mixed gases react on high temperature endurable substrate on which the small size single crystalline diamonds are pre-positioned. The small size single crystalline diamonds grow gradually to form thin film coating or thick polycrystalline coating with the same spatial structure as the diamond atoms, which are then separated from the substrate to form self-supported polycrystalline diamonds.

There are following issues with existing techniques. For example, utilization rate of the reaction zones is low. Currently available microwave plasma technique only allows the diamonds to grow in one cross section and in one dimension, which actually can grow inside the entire plasma sphere. In addition, the produced diamonds need to be cut after the production process, which increases the production cost and deceases the production efficiency. Method disclosed in U.S. Pat. No. 5,015,528 is directed to grow diamonds under the hydrogen atmosphere using fluidized bed, which allows the diamond growth larger than 0.1 mm. However, it is very difficult to grow larger diamonds using this method since the larger the particles, the higher flow is needed in the fluidized bed. The higher flow would destroy the conditions that are suitable for diamonds to grow. Industrial method such as microwave plasma requires low pressure or vacuum to make the atmosphere suitable for diamonds to grow where the seeds would be difficult to float. The methods provided in this invention can be applied to make the small size seeds grow larger by keeping the seeds continuously and repeatedly in moving state when passing the reaction zones that are suitable for diamonds to grow.

SUMMARY

The present invention is directed to methods and systems for the production of large size diamonds.

The invention provides a method of producing large size diamonds. The method provides the high temperature endurable small size seeds in motion in the process of diamond growth with high utilization rate of reaction zones, high overall growth rate in three dimensions, and no limit on the size of the formed diamonds. Moreover, this method will obtain the large size diamond without cutting, thus, leads to large-scale, low cost to produce large size diamonds.

The invention provides a method of producing large size diamonds. The method involves the steps of introducing the carbon containing gases and supplementary gases to form reaction zones that are suitable for diamonds growth. At the temperatures that are suitable for diamonds to grow, the high temperature endurable small size seeds are kept in motion in the reaction zones to form large size diamonds.

In one embodiment, carbon containing gases may include one or a combination of the following substances: methane, acetylene, ethanol gases and gases that contain carbon, hydrogen, oxygen, and nitrogen; the supplementary gases may include one or a combination of the following substances: hydrogen, oxygen, and inert gases. The high temperature endurable small size seeds may include one or a combination of the following substances: diamonds, carbon, graphite, silicon, ceramics, and high temperature endurable small size metal particles.

In another embodiment, methods of keeping high temperature endurable small size seeds in motion in the reaction zones include using spouted bed, fluidized bed, moving bed or rotary furnace; or using the methods of pneumatics, shaking, mechanical handling, inverting, and throwing (ejectting).

In another embodiment, methods of keeping the high temperature endurable small size seeds in motion in reaction zones or at least two reaction zones include passing the small size seeds in reaction zones repeatedly; especially, by self-rotating in the reaction zones.

In another embodiment, methods to control the high temperature endurable small size seeds to pass the reaction zones repeatedly include passing the small size seeds in the reaction zones repeatedly from top to bottom, from bottom to top, or from any arbitrary angles.

In another embodiment, methods of keeping the high temperature endurable small size seeds at the temperatures that are suitable for diamonds to grow include the use of direct or indirect cooling.

In another embodiment, method of producing large size diamonds includes continuously adding the high temperature endurable small size seeds to the reaction chamber and collecting the produced large size diamonds.

In another embodiment, the reaction zones that are suitable for diamonds to grow include direct current arc formed by the carbon containing gases and supplementary gases; or DC plasma jet formed by the carbon containing gases and supplementary gases; or excited reaction zones formed by the carbon containing gases and supplementary gases passing through the hot filament; or microwave plasma reaction zones formed by the mentioned carbon containing gases and supplementary gases passing through microwave; or RF plasma reaction zones formed by the carbon containing gases and supplementary gases passing through high frequency.

By keeping the high temperature endurable small size seeds in motion at suitable temperatures and in the reaction zones that are suitable for diamonds to grow, the methods provided in this invention allow all the surfaces of the high temperature endurable small size seeds continually extend to form diamonds, then to form large size diamonds to realize large-scale, low cost to produce large size diamonds.

The present invention also provides systems that are used to produce large size diamonds using described methods. The systems include at least one reaction zone generating equipment that can be used to make the carbon containing gases and supplementary gases form reaction zones that are suitable for diamonds to grow; and motion generating equipments that can be used to keep the high temperature endurable small size seeds in motion in the reaction zones to form large size diamonds; and temperature control equipments that can be used to control the temperatures at range that is suitable for the high temperature endurable small size seeds to grow.

In one embodiment, the motion generating equipments may include spouted bed reactor, fluidized bed reactor, moving bed reactor, or rotary furnace reactor, or pneumatic generating equipment, shaking equipment, or mechanical handling equipment.

In another embodiment, the reaction zone generating equipments include one of the following conditions: the equipments should be located inside the reaction zones, or the reaction zones are formed inside the equipments.

In another embodiment, the motion generating equipments can be pneumatic generating equipment, shaking equipment, or mechanical handling equipment. The equipments also include reactor chamber, and the equipments are located inside the reactor chamber.

In another embodiment, the reaction zone generating equipments can be equipments to make the carbon containing and supplementary gases form direct current arc; or equipments to make the carbon containing and supplementary gases form DC plasma jet; or equipments to make the carbon containing and supplementary gases pass through hot filament to form excited reaction zones; or equipments to make the carbon containing and supplementary gases pass through high frequency to form RF plasma reaction zones.

In another embodiment, the equipments also include gases mixing device, which is connected to the gases inlet of the reaction zone generating equipments; and cooling collection device, which can be used to cool and collect the produced large size diamonds.

The systems provided in this invention produce large size diamonds by using the methods described to keep the high temperature endurable small size seeds in motion at suitable temperatures and in the reaction zones that are suitable for diamond to growth. The surfaces of the small size seeds extend continuously to form diamonds, and then to form the large size diamonds, and finally to realize large-scale, low production cost to produce large size diamonds.

DETAILED DESCRIPTIONS

Detailed description and implementation of the present invention is further described in combination with the drawings and examples.

Figure 1:
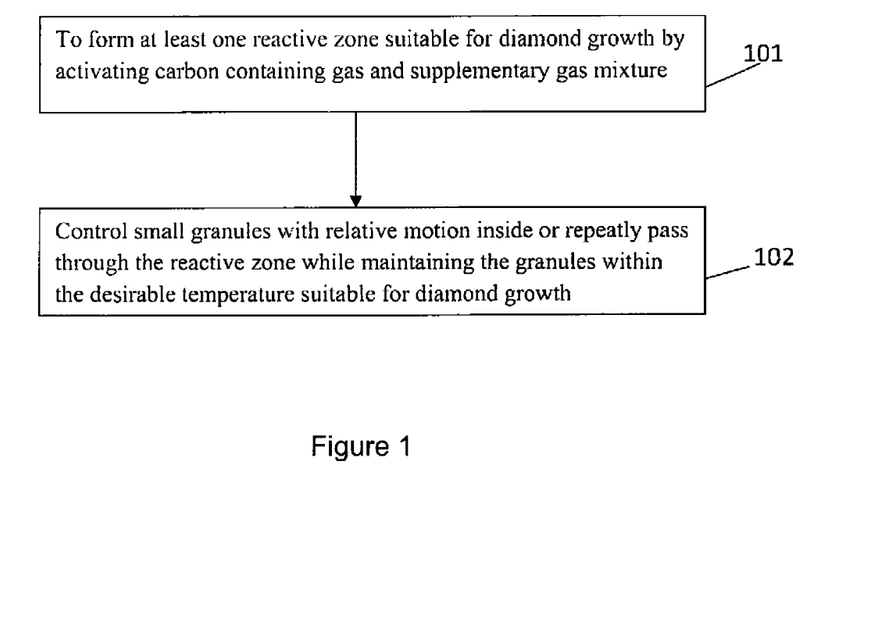
FIG. 1 is an example of schematic diagram of methods for producing large size diamonds.

FIG. 1 is an example of schematic diagram of methods for producing large size diamonds based on this invention. As shown in FIG. 1, the method includes Step 101, using the carbon containing gases and supplementary gases to form at least one reaction zone that is suitable for diamonds to grow.

The carbon containing gases include one or a combination of the following substances: methane, acetylene, ethanol gases and gases that contain carbon, hydrogen, oxygen, and nitrogen; ethanol gas means the gasified ethanol, gases that contain carbon, hydrogen, oxygen, and nitrogen mean gasified gases from organic substances that contain carbon, hydrogen, oxygen, and nitrogen; the supplementary gases include one or a combination of the following substances: hydrogen, oxygen, and inert gases.

The carbon containing gases and supplementary gases enter the reaction zone generating equipments, and then excited by the equipments to form reaction zones that are suitable for diamonds to grow. The reaction zone generating equipments can be one or more to form one or multiple reaction zones. Multiple reaction zones can be vertically or horizontally connected in series.

The reaction zone generating equipments include at least one of the followings.

(1) Equipments to make the carbon containing and supplementary gases form direct current arc. The outside area of the direct current arc is suitable for diamonds to grow. The cross section of the direct current arc can be circle, square, or rectangle shape, and this cross section area should be stable.

(2) Equipments to make the carbon containing and supplementary gases form DC plasma jet. The middle area of the DC plasma jet is suitable for diamonds to grow.

(3) Equipments to make the carbon containing and supplementary gases pass through hot filament to form excited reaction zones. The excited zone is suitable for diamonds to grow.

(4) Equipments to make the carbon containing gases and supplementary gases pass through microwave to form microwave plasma reaction zones. The microwave reaction zone is suitable for diamonds to grow.

(5) Equipments to make carbon containing and supplementary gases pass through high frequency to form RF plasma reaction zones. The RF plasma reaction zone is suitable for diamonds to grow.

There are several methods to excite the carbon containing and supplementary gases to form reaction zones. Lux and Haubner (Lux, B. Haubner R., J. Ref. Hard Metals, 1989, 8(3): 158) summarized the excitation methods into four types.

(1) High temperature excitation (for example: hot filament, laser, arc discharge, arc plasma jet, DC plasma jet etc.).

(2) Electric or electric magnetic excitation (for example: microwave, radio frequency discharge, direct current and indirect flow discharge).

(3) Plasma discharge methods (for example: radio frequency, microwave, direct current plasma discharge etc.).

(4). Combination methods (for example: hot filament+microwave, hot filament+direct current discharge, hot filament+bias voltage).

In the examples provided in the invention, the purity of the carbon containing and supplementary gases, the ratio of the carbon containing to supplementary gases, the temperature of the plasma atmosphere, and the degree of vacuum in the plasma atmosphere are designed to be suitable for diamonds to grow.

Using common methods such as direct current arc, DC plasma jet, hot filament, microwave plasma, or RF plasma to excite the carbon containing and supplementary gases are simply examples. The example doesn't limit the detail methods to excite the gases as long as the methods have the capability to excite the carbon containing and supplementary gases to form reaction zones that are suitable for diamonds to grow. Among these methods, method to form DC plasma jet by combustion of acetylene and oxygen can be referred to Y. Hirose et al., Appl. Phs. Lett. 1988, 52 (6): 437-438, and S. Yugo et al., ppl. Phys. Lett., 1991, 58(10):1036; method to form DC arc by high pressure electrode can be referred to Ohtake et al., "Diamonds Film Preparation by Arc Discharge Plasma Jet Chemical Vapor Deposition in the Methane Atmosphere", J. Electrochem. Soc. Vol. 137, No. 2 February 1990; method to form microwave plasma by exciting microwave can be referred to Wuyi Wang, "Gem-quality Synthetic Diamondss Grown by a Chemical Vapor Deposition (CVD) Method", Gems & Gemology, Winter 2003 pp: 268; method to form RF plasma by high frequency induction can be referred to S. K. Baldwin, et al "Growth Rate Studies of CVD Diamonds in an RF Plasma Torch", Plasma Chem. And Plasma Processing, vol. 14, No. 4, 1994. The published content is summarized herein, and the detail methods will not be stated any further.

Step 102 provides the means to keep the high temperature endurable small size seeds in motion in the reaction zones to form large size diamonds at the temperatures that are suitable for diamonds to grow.

The high temperature endurable small size seeds include one or a combination of the following substances: diamonds, carbon, graphite, silicon, ceramics, and high temperature endurable small size metal particles. As long as the small size seeds can endure high temperature (the temperature is between 700-1000° C., which is suitable for diamonds to grow), they can be used as seeds to produce large size diamonds. The large size diamonds in this invention means the particles with their size larger than that of their seeds and their surface composition having the same structure as that of the diamond.

The reaction zones are excited region where is suitable for diamonds to grow. The high temperature endurable small size seeds are put into the reaction zones at the system control point, and they can be kept in motion to pass the reaction zones repeatedly by using the motion generating equipments, or they can be controlled to be in motion inside the reaction zones, also they can be controlled to do self rotation while they are moving; In addition, the high temperature endurable small size seeds can be controlled to be in motion in at least two reaction zones.

When the high temperature endurable small size seeds are kept in motion (especially at the self rotation status), the carbon in the reaction zones absorbs onto the surfaces of the high temperature endurable small size seeds. They grow at the seeds' surfaces and form the diamonds structure. This makes the relatively small seeds to grow into larger diamonds. Compared to the currently available method to grow diamonds on substrate, all seeds' surfaces have the opportunity to grow diamonds since the seeds are kept in motion in the reaction zones in the present invention. This method can produce larger size diamonds in higher efficiency compared with the currently available low efficiency method that the diamonds can only grow in the single dimension on the substrate; In addition, since the seeds in this invention can self rotate in the reaction zones, the diamonds can grow evenly on the seed's surface to completely wrapped the seeds. Therefore, in the case of using non-diamonds as seeds, seeds' surfaces are wrapped tightly to form large size diamonds, which is convenient for industrial applications. In addition, motion generating equipments can control the high temperature endurable small size seeds to pass the reaction zones repeatedly, which make the seeds grow continuously to avoid multiple seeds forming a large block.

The motion generating equipments can be spouted bed reactor, fluidized bed reactor, moving bed reactor, or rotary furnace reactor. The high temperature endurable small size seeds are located in any one of these reactors. Correspondingly, there are reaction zones that are suitable for diamonds to grow inside the reactor or the entire reactor is located inside those reaction zones, and the reactor drives the high temperature endurable small size seeds in motion in the reaction zones.

The motion generating equipments can also be pneumatic generating equipment, shaking equipment, or mechanical handling equipment. When the motion generating equipments are pneumatic generating equipment, shaking equipment, or mechanical handling equipment, the equipments are located inside the chamber of the reactor. The reaction zones generated by reaction zone generating equipments that are suitable for diamonds to grow are located inside the reactor chamber or outside the reactor chamber. The motion generating equipments make the high temperature endurable small size seeds move in the reaction zones. That is to say, via the methods of pneumatics, shaking, mechanical handling, inverting, and throwing, the high temperature endurable small size seeds are at the motion state while passing the reaction zones or keep moving in the reaction zones. The mode of passing the reaction zones repeatedly can be from top to bottom, from bottom to top, or from any arbitrary angles.

Direct or indirect cooling method can be applied to keep the high temperature endurable small size seeds at the temperatures that are suitable for diamonds to grow. For example, heat exchanger can be installed on the reactor chamber. The high temperature endurable small size seeds that are inside the reactor chamber are kept at the temperatures that are suitable for diamonds to grow through heat exchanging. It is also feasible to reduce the airflow rate during the transportation of high temperature endurable small size seeds in order to guarantee these seeds at the temperatures that are suitable for diamonds to grow.

According to the detailed embodiment of this invention, batch or continuous process can be applied to produce large size diamonds. When method of continuous production of large size diamonds is used, the high temperature endurable small size seeds can be added to the reactors continuously. The produced large size diamonds are separated from the reactors continuously to realize large-scale continuous production.

According to the methods of producing large size diamonds provided by the examples in this invention, keeping the high temperature endurable small size seeds in motion and at the suitable temperatures and reaction zones allows the surfaces of the small size seeds extend continuously to form diamonds, and then to form the large size diamonds, which realizes large-scale, low cost to produce large size diamonds. This invention has at least the following advantages.

(1) the seeds keep moving in the reaction zones, which avoids forming a layer of graphite if the seeds are pre-positioned on the substrate.

(2) after production, there is no need to perform a cutting process since the produced product is diamonds themselves. This method dramatically reduces production cost and improves production efficiency.

(3) The seeds keep moving in the reaction zones, which make all the seeds' surfaces have the opportunity to form diamonds. Therefore, this method improves the production efficiency.

(4) Since the seeds can self-rotate in the reaction zones, the produced diamonds on the seeds' surfaces are well shaped, and can wrap the seeds completely. Therefore, when non-diamonds are used as seeds, large size diamonds with seeds' surfaces tightly wrapped can be obtained too. This is convenient for industrial application.

The example in this invention also provides systems for producing large size diamonds. The systems include at least one reaction zone generating equipment, motion generating equipment, and temperature control equipment.

The reaction zone generating equipments make the carbon containing gases and supplementary gases form reaction zones that are suitable for diamonds to grow. The motion generating equipments keep the high temperature endurable small size seeds in motion in the reaction zones to form large size diamonds. Temperature control equipments are used to control the temperatures at which the high temperature endurable small size seeds are suitable for growing to diamonds.

The motion generating equipments can include spouted bed reactor, fluidized bed reactor, moving bed reactor, rotary furnace reactor, pneumatic generating equipment, shaking equipment, or mechanical handling equipment.

When the motion generating equipments include the pneumatic generating equipment, shaking equipment, or mechanical handling equipment, the equipments also include one reactor chamber. The motion generating equipments are located inside the reactor chamber. The motion generating equipments can use the methods of pneumatics, shaking, mechanical handling, inverting, and throwing to keep the high temperature endurable small size seeds in motion while passing the reaction zones or to keep the seeds in motion in the reaction zones. Optionally, the seeds can also self rotate; the mode of passing the reaction zones repeatedly can be from top to bottom, from bottom to top, or from any arbitrary angles.

It should be pointed out that when the motion generating equipments include spouted bed reactor, fluidized bed reactor, moving bed reactor, or rotary furnace reactor, the motion generating equipments themselves are reactors. They provide the reactor chamber that is necessary for diamonds to grow. However, when the motion generating equipments include the pneumatic generating equipment, shaking equipment, or mechanical handling equipment, they are only severed as transportation or shaking equipment. Therefore, a reactor chamber is needed.

Furthermore, the reaction zone generating equipments include one of the following conditions: the equipments should be located inside the reaction zones, or the reaction zones are formed inside the equipments.

Reaction zone generating equipments include one or a combination of the followings: equipments to make the carbon containing and supplementary gases form direct current arc; equipments to make the carbon containing and supplementary gases form DC plasma jet; equipments to make the carbon containing gases and supplementary gases pass through hot filament to form excited zones; equipments to make the carbon containing gases and supplementary gases pass through microwave to form microwave plasma reaction zones; equipments to make the carbon containing and supplementary gases pass through high frequency to form RF plasma reaction zones.

Moreover, the reaction zone generating equipments can be one or more to form one or multiple reaction zones. Multiple reaction zones can be vertically or horizontally connected in series.

Furthermore, the equipments can also include gas mixing device and cooling collection device.

The gas mixing device is connected to the gas inlet of the reaction zone generating equipments. It is used to deliver the carbon containing gas and supplementary gas to the reaction zone generating equipments.

Cooling collection device is used to cool and collect the produced large size diamonds.

Furthermore, when the reaction zones that are suitable for diamonds to grow are microwave plasma zones, or RF plasma zones, the equipments provided in the example may also include vacuum generating equipment to provide vacuum atmosphere in the reaction zones. Since a certain degree of vacuum is needed for diamonds to grow under microwave plasma or RF plasma atmosphere, vacuum generating equipment is needed to provide vacuum to the reactor chamber.

With the equipments provided in this example, batch or continuous process can be applied to produce large size diamonds. When method of continuous production of large size diamonds is used, the high temperature endurable small size seeds can be added to the reactors continuously. The produced large size diamonds are separated in the reactors continuously to realize large-scale continuous production.

Examples are provided to demonstrate the method to produce large size diamonds using the equipments described in this invention.

According to the systems provided in this invention, keeping the high temperature endurable small size seeds in motion and at the suitable temperatures and in reaction zones allows the surfaces of the small size seeds extend continuously to form diamonds, and then to form large size diamonds, which realizes large-scale, low cost to produce large size diamonds. Furthermore, using the systems and equipments provided in the example to produce large size diamonds results in several advantages as described in the methods.

Detailed descriptions of the examples are given based on the attached Figures.

Figure 2:
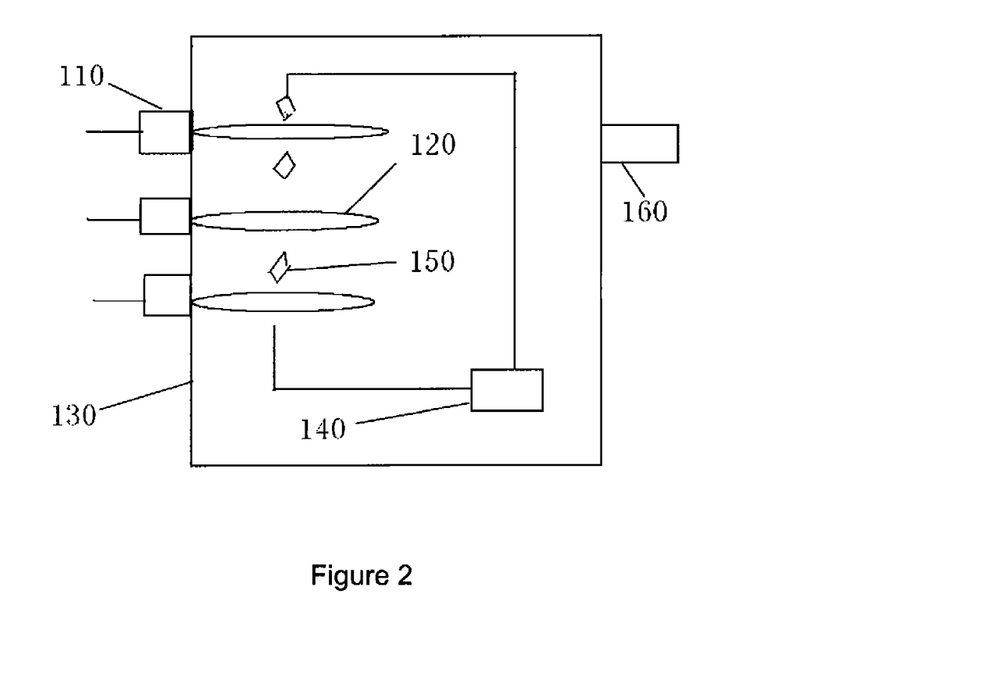
FIG. 2 is a schematic diagram of process example 1 for producing large size diamonds.

FIG. 2 is the schematic diagram of process example 1 for producing large size diamonds based on this invention. This process is for the producing large size diamonds using multiple reaction zones. As shown in FIG. 2, the equipments for producing large size diamonds include multiple plasma generators 110, reactor chamber 130, transportation system 140, and vacuum pump 160. The plasma flame is generated by transportation system 140, and plasma generator 110 is located inside the reactor chamber 130. Several plasma flame excited zones 120 are generated by multiple plasma generators 110 (the excited zones are equivalent to the above mentioned reaction zones); The transportation system 140 can make several high temperature endurable small size seeds form circulating particle flow 150. The vacuum pump 160 provides the needed vacuum for the internal reactor chamber 130.

The carbon containing gases and hydrogen enter into multiple plasma generators 110. The plasma generators 110 generate several plasma flame excited zones 120. The vacuum pump 160 provides certain degree of vacuum, which is suitable for diamonds to grow for the internal reactor chamber 130. The transportation system 140 carries the high temperature endurable small size seeds through the plasma flame excited zones repeatedly. When the small size seeds pass the plasma flame excited zones 120, they absorb the composition of diamonds continuously and grow gradually to form larger size diamonds.

The example uses multiple plasma generators, which make the small size seeds pass multiple plasma environments in one circulation. This improves the speed of diamonds growth. Of course, there is no restriction on the quantity of the plasma generators in this case, which can be one or multiple.

Figure 3:
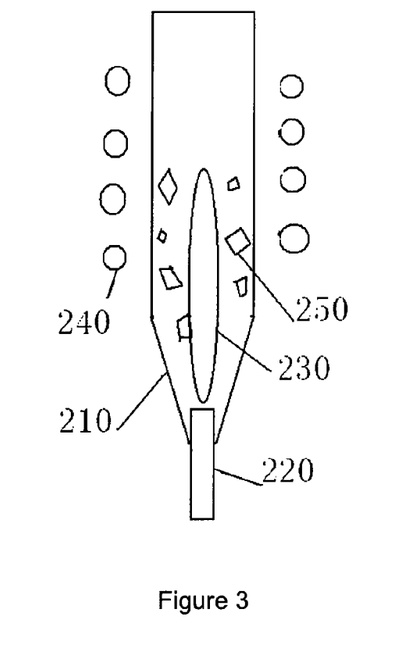
FIG. 3 is a schematic diagram of process example 2 for producing large size diamonds.

FIG. 3 is the schematic diagram of process example 2 for producing large size diamonds based on this invention. The reactor in this process can be spouted bed reactor. As shown in the FIG. 3, the equipments for producing large size diamonds include spouted bed reactor 210, and plasma generator 220. The spouted bed reactor can be any of the above-mentioned motion generating equipments. The plasma generator 220 generates plasma flame 230 (equivalent to the above mentioned reaction zones) under the condition of inductive coupling. The equipment can also include RF high frequency induction coil 240.

The diamonds seeds 250 (the high temperature endurable small size seeds in this example are diamonds seeds) which are positioned in the spouted bed move up and down by the spouting force from plasma flame 230. The plasma flame 230 is generated by plasma generator 220. The diamond seeds 250 are in and out of the plasma flame 230 repeatedly. Whenever the diamond seeds 250 enter the plasma flame 230, they deposit on the surfaces of the diamonds and grow gradually to form larger size diamonds.

Figure 4:
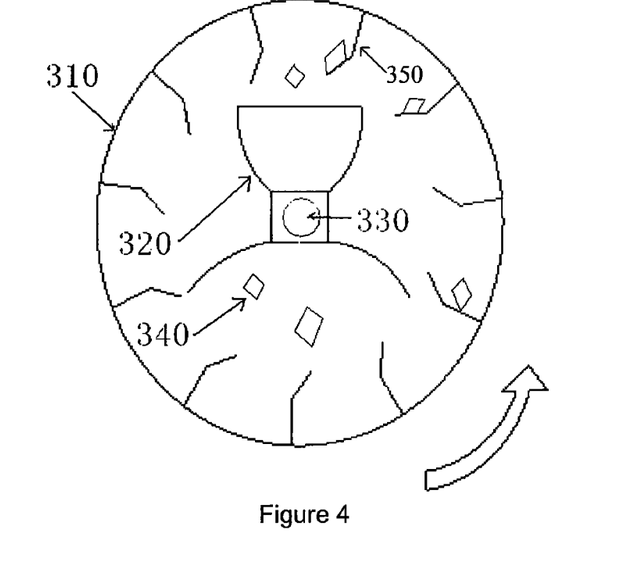
FIG. 4 is a schematic diagram of process example 3 for producing large size diamonds.

FIG. 4 is the schematic diagram of process example 3 for producing large size diamonds based on this invention. The reactor in this example is rotary reactor. As shown in the FIG. 4, the equipments for producing large size diamonds include rotary reactor 310 and plasma generator (not shown in the Figure); the rotary reactor 310 can be any of the above-mentioned motion generating equipments. The rotary reactor 310 includes: reactor funnel 320 and shoveling plate 350. The plasma generator is located at the plasma excited zones 330 which is perpendicular to the paper plane and inside the chamber of reactor 310 (equivalent to the above mentioned reaction zones); when necessary, vacuum pump can be added to provide certain degree of vacuum for the internal chamber of reactor.

The rotary reactor 310 self-rotates counter clock wisely in a fixed low speed by external force. The diamond seeds 340 that are positioned in the rotary reactor 310 are transported to the top of the funnel 320 by the aid of the shoveling plate 350, which is mounted onto the inside wall of the reactor chamber. Then the seeds fall to the funnel by gravity, and pass the plasma excited zone 330 to absorb the composition of diamonds and grow. After the seeds passed the plasma excited zone 330 and fell, they are collected by the shoveling plate 350 and transported back for the next circulation. The recirculation can make the smaller sized diamonds grow into larger sized diamonds.

Figure 5:
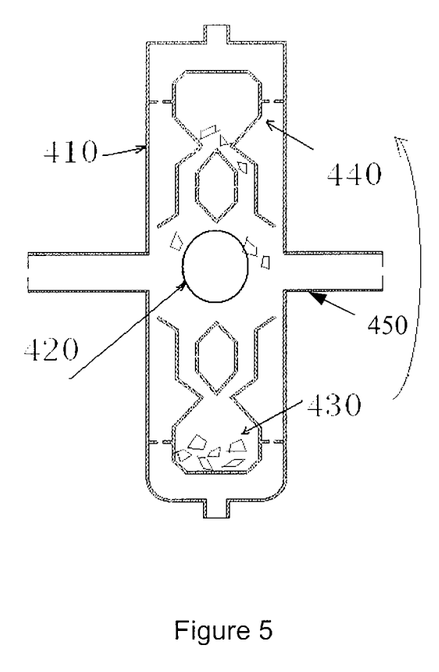
FIG. 5 is a schematic diagram of process example 4 for producing large size diamonds.

FIG. 5 is the schematic diagram of process example 4 for producing large size diamonds based on this invention. The rotary reactor used in this example takes advantage of the circular excited zone to grow into larger sized diamonds continuously.

The equipments for producing large size diamonds include rotary reactor 410. Combustion flame forms a circular excited zone 420 inside the rotary reactor 410 (equivalent to the above mentioned reaction zones); the rotary reactor 410 can be any of the above-mentioned motion generating equipments. There is diamond seeds flow control equipment 440 inside the rotary reactor 410, through which the seeds can be controlled to just pass the circular excited zone 420 while they move up and down.

The rotary reactor 410 keeps rotating up and down around the shaft 450. The diamond seeds 430 that are positioned in the control equipment 440 move between the two inside ends of control equipment 440 and pass the circular excited zone 420 repeatedly by gravity. When the diamond seeds pass the circular excited zones 420, they absorb the composition of diamonds and grow gradually to form larger sized diamonds.

Figure 6:
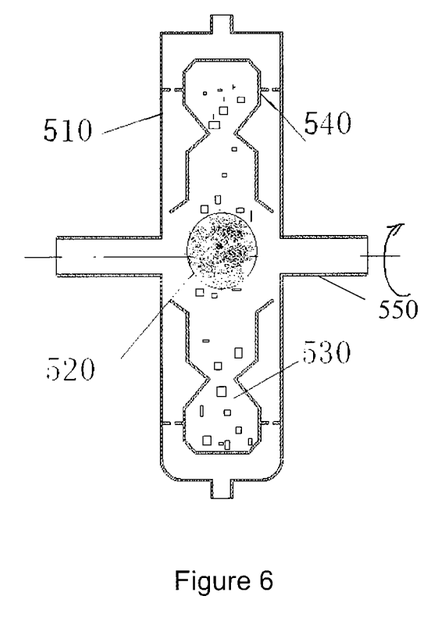
FIG. 6 is a schematic diagram of process example 5 for producing large size diamonds.

FIG. 6 is the schematic diagram of process example 5 for producing large size diamonds based on this invention. The rotary reactor used in this example takes advantage of the spherical excited zone to grow into larger sized diamonds continuously. As shown in FIG. 6, the equipments for producing the large size diamonds include rotary reactor 510, plasma generator (not shown in the Figure), and vacuum pump (not shown in the Figure). The plasma generator forms a spherical excited zone 520. The zone is spherical shape where there is suitable gas composition and temperature atmosphere for diamonds to grow; the rotary reactor 510 can be any of the above-mentioned motion generating equipments. There is a diamond seed flow control equipment 540 inside the rotary reactor 510, through which the seeds can be controlled to just pass the spherical excited zone 520 while they move up and down.

The rotary reactor 510 keeps rotating up and down around the shaft 550. The diamond seeds 530 that are positioned in the control equipment 540 move between the two inside ends of control equipment 540 and pass the spherical excited zone 520 repeatedly by gravity. When the diamond seeds pass the spherical excited zone 520, they absorb the composition of diamonds and grow gradually to form larger sized diamonds.

AN EXPERIMENTAL EXAMPLE

Combustion flame formed by reaction of acetylene with pure oxygen (ratio 1:1, flow rate 6-7 slpm) spouts from the bottom of the conical shaped quartz tube, which has a diameter of 40 mm, forming a spouted bed. The pyrolytic carbon particles (50 gram) with diameter of 0.5-2 mm move up and down in the spouted bed; with no insulation for the quartz tube and its outside part. Shown by the infrared thermometer, the particles' temperature is kept at 800-900° C. during steady state running. After the system run for two hours, Ar was used to cool down the particles to room temperature. It was found that the total weight increased by 3.78 gram.

Figure 7:
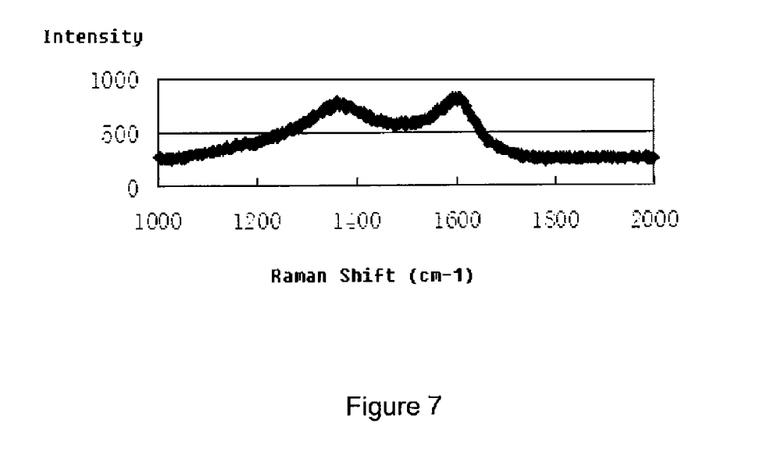
FIG. 7 shows Raman spectrum of currently available pyrolytic carbon particles.
Figure 8:
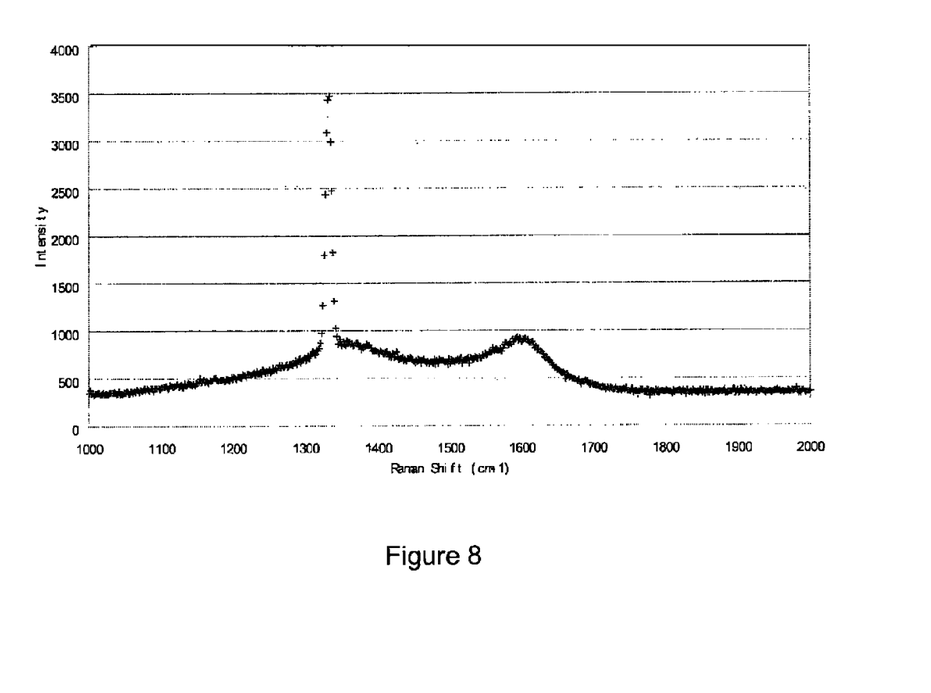
FIG. 8 shows Raman spectrum of large size diamonds produced by an example of the method.

FIG. 7 is the Raman spectrum of currently available pyrolytic carbon particles. For the non-reacted pyrolytic carbon particles, there are only two broad peaks that are corresponding to the graphite. FIG. 8 is Raman spectrum of large size diamonds produced in this example. As shown in FIG. 8, except for the peaks for graphite, there is a strong signal for diamonds. It indicates that there is diamonds composition on the surfaces of the pyrolytic carbon particles. The increase in the total weight means the increases in the particle size.

Continuously running the reaction according to the above procedure (adding carbon particles continuously to the spouted bed), the process continues until certain sized diamonds are obtained.

In this example, the pyrolytic carbon particles can be replaced by any other high temperature endurable small size seeds. Based on the same operation method, larger sized diamonds can be obtained also. In the case of the spouted bed replaced by any one of the motion generating equipments, or the combustion flame replaced by any one of the reaction zones, larger sized diamonds can also be obtained.

By using above-mentioned process examples to produce large size diamonds, they have the same advantages as mentioned in the examples of methods and equipments in this invention.

Finally, the embodiments described in the present invention merely illustrate general technical schemes. The invention is not limited to any specific embodiments. Despite the detailed description referred in the aforementioned embodiment of the present invention, one skilled in the art should understand that modifications can be made in the technical diagram and certain technical embodiments can be modified or replaced. However, they are not necessarily deviated from the nature of spirit and scope of the invention.

What is claim is:

1. A method of producing large size diamonds, the method comprising:
   Providing a spouted bed reactor into which carbon containing gases and supplementary gases are introduced in concentrations effective for diamonds to grow;
   using microwaves to create at least a first plasma reaction zone and at least a second plasma reaction zone within the reactor; and
   adding high temperature endurable small size seeds to one or more of the first plasma reaction zone and the second plasma reaction zone, wherein the spouted bed sets the small size seeds in motion repeatedly through the first plasma reaction zone and the second plasma reaction zone at temperatures that are effective for the small size seeds to form larger size diamonds.

2. The method of producing large size diamonds of claim 1, further comprising using pneumatics, shaking, mechanical handling, inverting, and throwing to keep the high temperature endurable small size seeds in motion in the reaction zones.

3. The method of producing large size diamonds of claim 1, wherein the high temperature endurable small size seeds in motion repeatedly pass through the reaction zones from top to bottom, from bottom to top, or from any arbitrary angles.

4. The method of producing large size diamonds of claim 1, further comprising: applying direct or indirect cooling to keep the high temperature endurable small size seeds at temperatures that are effective for diamonds to grow.

5. The method of producing large size diamonds of claim 1, further comprising: adding the high temperature endurable small size seeds continuously to the reactor, and collecting the produced large size diamonds.

6. The method of producing large size diamonds of claim 1, wherein the carbon containing gases are selected from one or a combination of methane, acetylene, ethanol gases and gas mixtures that include carbon, hydrogen, oxygen, and nitrogen.

7. The method of producing large size diamonds of claim 1, wherein the high temperature endurable small size seeds are selected from one or more of diamonds, carbon, graphite, silicon, ceramics, and high temperature endurable small size metal particles.

8. The method of claim 1, further comprising keeping the high temperature endurable small size seeds self-rotating in the reaction zones.

* * * * *